(12) United States Patent
Shea

(10) Patent No.: US 7,442,979 B2
(45) Date of Patent: Oct. 28, 2008

(54) REDUCED CELL-TO-CELL SHORTING FOR MEMORY ARRAYS

(75) Inventor: Kevin R Shea, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/678,173

(22) Filed: Feb. 23, 2007

(65) Prior Publication Data

US 2007/0131995 A1 Jun. 14, 2007

Related U.S. Application Data

(60) Division of application No. 11/190,736, filed on Jul. 26, 2005, which is a continuation of application No. 10/713,360, filed on Nov. 14, 2003, now Pat. No. 7,091,085.

(51) Int. Cl.
  *H01L 27/108* (2006.01)
  *H01L 29/94* (2006.01)
(52) U.S. Cl. ............... 257/298; 257/296; 257/E27.089
(58) Field of Classification Search .......... 257/298, 257/296, E27.089
  See application file for complete search history.

(56) References Cited

U.S. PATENT DOCUMENTS

| | | | |
|---|---|---|---|
| 4,957,590 A | 9/1990 | Douglas | |
| 5,236,868 A | 8/1993 | Nulman | |
| 5,270,241 A | 12/1993 | Dennison et al. | |
| 5,418,180 A | 5/1995 | Brown | |
| 5,616,961 A | 4/1997 | Kohyama | |
| 6,020,248 A | 2/2000 | Zenke | |
| 6,258,691 B1 | 7/2001 | Kim | |
| 6,306,775 B1 | 10/2001 | Li | |
| 6,326,277 B1 | 12/2001 | DeBoer | |
| 6,329,263 B1 | 12/2001 | Durcan et al. | |
| 6,358,793 B1 | 3/2002 | Yates et al. | |
| 6,383,886 B1 | 5/2002 | Ping | |
| 6,451,661 B1 | 9/2002 | DeBoer et al. | |
| 6,524,907 B2 | 2/2003 | Parekh et al. | |
| 6,566,222 B2 | 5/2003 | DeBoer | |
| 6,576,947 B1 * | 6/2003 | Kim | 257/309 |
| 6,613,674 B1 * | 9/2003 | Andreas | 438/690 |
| 6,645,851 B1 * | 11/2003 | Ho et al. | 438/626 |
| 6,680,502 B2 | 1/2004 | Clampitt | |
| 6,720,232 B1 * | 4/2004 | Tu et al. | 438/396 |
| 6,753,618 B2 | 6/2004 | Basceri et al. | |
| 6,784,479 B2 * | 8/2004 | Park | 257/308 |
| 6,794,245 B2 | 9/2004 | Zheng | |
| 2002/0192901 A1 * | 12/2002 | Kimura et al. | 438/253 |
| 2003/0003710 A1 * | 1/2003 | Modak | 438/625 |
| 2003/0025145 A1 | 2/2003 | Nakamura | |
| 2004/0014279 A1 | 1/2004 | Zheng | |
| 2004/0036051 A1 * | 2/2004 | Sneh | 251/301 |

* cited by examiner

*Primary Examiner*—Bradley W. Baumeister
*Assistant Examiner*—Igwe U. Anya
(74) *Attorney, Agent, or Firm*—Knobbe Martens Olson & Bear LLP

(57) ABSTRACT

Bottom electrodes of memory cell capacitors are recessed to prevent electrical shorts between neighboring memory cells. A partially fabricated memory cell capacitor has a bottom electrode comprising titanium nitride (TiN) and hemispherical grained (HSG) silicon. The container housing the capacitor is filled with photoresist and then planarized. The TiN layer is then selectively recessed with a peroxide mixture and subsequently the HSG silicon layer is recessed using tetramethyl ammoniumhydroxide. Thus, the bottom electrode is recessed below the level of particles which may overlie the memory cell capacitors and cause shorts by contacting the bottom electrode.

14 Claims, 12 Drawing Sheets

REDUCED CELL-TO-CELL SHORTING FOR MEMORY ARRAYS

REFERENCE TO RELATED APPLICATION

This application is a divisional of U.S. application Ser. No. 11/190,736, filed Jul. 26, 2005, which is a continuation of U.S. application Ser. No. 10/713,360, filed Nov. 14, 2003 (now U.S. Pat. No. 7,091,085, issued Aug. 15, 2006).

FIELD OF THE INVENTION

This invention relates generally to semiconductor device fabrication and, more particularly, to selectively recessing deposited layers in semiconductor structures such as partially formed capacitors.

BACKGROUND OF THE INVENTION

As a consequence of many factors, including demand for increased portability, computing power and energy efficiency in modem electronics, integrated circuits are continuously being reduced in size and the density of electrical devices, e.g., capacitors and transistors, in these integrated circuits are constantly increasing as a result of this size reduction.

The trend of increasing electrical device densities is evident, for example, in memory circuits such as dynamic random access memories (DRAMs), static random access memories (SRAMs), ferroelectric (FE) memories, etc. To take one example, DRAM is typically fabricated by forming millions of identical circuit elements, known as storage or memory cells, on a single semiconductor wafer. Each of these cells is an addressable location that can store one bit (binary digit) of data. In its most general form, a memory cell typically consists of two electrical devices: a storage capacitor and an access field effect transistor. By increasing the density of these electrical devices, the memory cell density of these memory circuits can be increased, thereby increasing the storage capacity of a single memory chip.

As part of this trend of increasing electrical device density, there is constant pressure to decrease the feature size or area occupied by these devices, such as capacitors, to allow for further increases in device density. Nevertheless, capacitors must have a capacitance large enough to retain a certain minimum charge, as determined by design and operational parameters, to ensure reliable operation of the memory cell. Because capacitors are, most generally, two electrodes on either side of a dielectric and because capacitance is proportional to the surface areas of opposing electrodes, one way to increase the capacitance of a memory cell capacitor, while minimizing the area occupied by the capacitor, is to increase the surface area of the lower electrode of the capacitor. For this purpose, hemispherical grain (HSG) silicon, which forms a convoluted surface with numerous protrusions, has been used to increase the surface area of the lower electrode of capacitors.

While capacitors using HSG silicon for electrodes have allowed further increases in device densities, increasing device densities have also made integrated circuits more susceptible to shorts between devices. In particular, it has been found that neighboring capacitors in memory circuits are particularly prone to electrical shorts between their bottom electrodes.

Accordingly, there is a need for methods of preventing electrical shorts between electrical devices such as capacitors.

SUMMARY OF THE INVENTION

In accordance with one aspect of the invention, a process is provided for fabricating a bottom electrode for a DRAM cell capacitor. The process comprises forming a container in an insulating layer overlying a semiconductor substrate. The container is lined with a hemispherical grained silicon layer. A metal nitride layer is deposited over the hemispherical grained silicon layer and a remainder of the container is filled with a photoresist. The photoresist, the metal nitride layer and the hemispherical grained silicon layer are removed down to the top surface of the insulating layer. The metal nitride layer and the hemispherical grained silicon layer are then recessed by selectively partially removing the metal nitride layer and the hemispherical grained silicon layer relative to the photoresist.

In accordance with another aspect of the invention, a method is provided for semiconductor fabrication. The method comprises providing a surface on a substrate, the surface comprising metal nitride and a photoresist. The metal nitride is then selectively recessed relative to the photoresist.

In accordance with yet another aspect of the invention, a method is provided for fabricating an integrated circuit. The method comprises providing an insulating material on a semiconductor substrate. The insulating material has a container in it. A metal nitride layer is deposited inside the container. The metal nitride layer is preferentially partially removed by being exposed to a peroxide mixture with the partially formed integrated circuit maintained at a temperature between about 20° C. and about 55° C.

In accordance with another aspect of the invention, a method is provided for fabricating a capacitor. The method comprises forming a container in an insulating layer overlying a semiconductor substrate. The container is lined with a hemispherical grained silicon layer and a titanium nitride layer is deposited over the hemispherical grained silicon layer. The hemispherical grained silicon layer is then recessed to a depth of between about 100 Å to about 500 Å below a top of the container by exposing the hemispherical grained silicon layer to a tetramethyl ammoniumhydroxide solution at a temperature between about 40° C. and about 65° C. The tetramethyl ammoniumhydroxide solution comprises between about 1.0 weight percent and about 4.0 weight percent tetramethyl ammoniumhydroxide.

In accordance with another aspect of the invention, an integrated circuit comprising a capacitor is provided. The capacitor comprises a structural layer overlying a semiconductor substrate. A container is disposed in the structural layer. The wall has a top surface. A bottom electrode extends vertically along the wall. The bottom electrode comprises a metal nitride layer and a hemispherical grained silicon layer. The top surface of the bottom electrode is about 100 Å to about 500 Å below the top terminus of the wall.

In accordance with yet another aspect of the invention, an integrated circuit is provided. The integrated circuit comprises an insulating layer having a cavity. The cavity is partially defined by a generally vertical surface of the insulating layer. A generally vertically extending metallic layer is disposed between the vertical surface and a generally vertically extending layer of an other material inside the cavity. The vertical surface is between about 0.5 μm and about 5.0 μm tall and the metallic layer is between about 100 Å and about 500 Å below a top of the vertical surface.

BRIEF DESCRIPTION OF THE DRAWINGS

The invention will be better understood from the Detailed Description of the Preferred Embodiments and from the appended drawings, which are meant to illustrate and not to limit the invention, and wherein.

DETAILED DESCRIPTION OF THE PREFERRED EMBODIMENT

It has been found that electrical shorts between nearby capacitors in an array of capacitors can be caused by conductive particles that extend between and make contact with the bottom electrodes of these capacitors. It has also been found that the presence of these particles can be a result of the processes used to form the capacitors.

For example, memory cell capacitors can be formed in a process involving the filling of containers. A container is first formed in an insulating layer. A HSG silicon layer is then formed overlying the entire substrate, including the surfaces of the container and the area between the individual containers. Next, partly to increase energy efficiency and to minimize heat generation, a metallic layer can be deposited directly over the HSG silicon to form the bottom electrode of a metal-insulator-metal-silicon (MIMS) capacitor, in which the electrodes of the capacitor are metals. The metallic layer is typically a metal nitride and a suitable metal nitride is titanium nitride. A filler material, such as photoresist, can then be used to fill the remainder of the container to physically and chemically protect the container during subsequent processing steps. After deposition of the photoresist, the continuous conductive TiN and HSG silicon layers lining the containers and extending between them on the upper surface of the structure is partially removed by chemical mechanical polishing (CMP) to separate the containers; that is, the conductive material between the containers is removed so that the conductive containers are electrically and physically isolated.

Figure 1A:
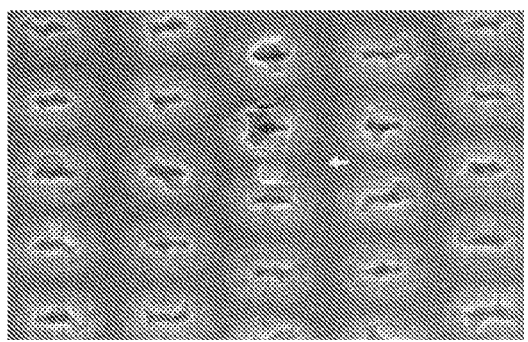
FIGS. 1A and 1B are micrographs, as viewed through a scanning electron microscope, of conductive particles that contact and can cause electrical shorts between neighboring capacitors.
Figure 1B:
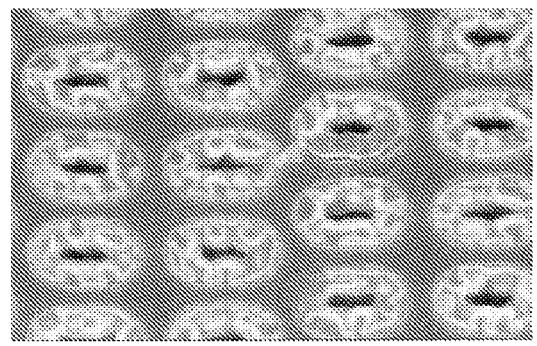

CMP, however, has been found to be ineffective at completely isolating the bottom electrode materials in the containers. For example, CMP of the TiN and HSG silicon layers has the unintended effect of pushing some TiN and HSG silicon grains or particles into the insulating material between the containers. In addition, particles can break off or otherwise become separated from the conductive layers and can fall between adjacent capacitor containers. Capacitors arrays having such broken off particles are shown in FIGS. 1A and 1B. After CMP, embedded particles that have fallen between the containers are difficult to remove by wash processes. Consequently, the particles can persist in the final capacitor structure and can cause electrical shorts between individual capacitors in finished integrated circuits.

Because the particles themselves are difficult to remove, one strategy for preventing the electrical shorts is to recess the bottom electrode layer so that the electrode does not contact the particles. For example, the bottom electrode materials, comprising HSG silicon can be exposed to etchants such as tetramethyl ammoniumhydroxide (TMAH). Conventional chemistries, however, have been found to inadequately recess the HSG silicon layer and, in any case, are unable to recess TiN. As a result, the TiN/HSG silicon bottom electrode material still extends relatively high in the container, continuing to cause shorts with embedded or broken off conductive particles between neighboring containers. Consequently, while having conductivity benefits as described above, it has been found that metal from metallic layers deposited over a HSG silicon layers diffuses into the HSG silicon layer, forming a material that traditional recess chemistries are ineffective at etching.

In addition, simply increasing the aggressiveness of traditional chemistries, e.g., by increasing process temperature or etchant concentration, has not been found to produce acceptable results, since more aggressive chemistries have been found to cause problems of their own. In particular, whereas traditional chemistries involving TMAH are unable to etch either TiN or the TiN/HSG silicon material, it has been found that, while more aggressive chemistries involving traditional peroxide mixtures can etch these conductive layers, these chemistries have the undesirable effect of preferentially etching the photoresist rather than the bottom electrode. Because the photoresist is removed first, the TiN layer is left exposed, which allows the etchant to contact and remove the TiN layer excessively down the height of the container before the top of the TiN and HSG silicon layers is effectively recessed. As a consequence, the TiN layer is removed, undermining the conductivity benefits sought by depositing the TiN layer in the first instance.

In view of these shortcomings, chemistries are provided herein that can be employed to selectively remove metal layers, e.g., metal nitride layers such as TiN layers, HSG silicon and intermediate metal/HSG silicon material in semiconductor structures, such as partially formed capacitor structures. In some preferred embodiments, these structures are exposed to etchants to selectively recess titanium nitride and HSG silicon layers in sequence. Preferably, the etchants are peroxide mixtures, including ammonium peroxide mixtures (APM) and hydrochloric acid peroxide mixtures (HPM). Advantageously, using these chemistries, bottom electrodes containing TiN and/or HSG silicon can be effectively recessed to address the problem of electrical shorts between capacitor container structures. In addition, the methods provided herein can selectively etch the TiN and the HSG silicon layers, including the interface between these layers comprising the TiN/HSG silicon material, without attacking the surface of the TiN layer deeper in the container.

Reference will now be made to the Figures, wherein like numerals refer to like parts throughout. It will be appreciated that FIGS. 2-11 are not drawn to scale.

While the preferred embodiments will find application in any context in which metal nitrides such as TiN, with or without HSG silicon, are desired to be selectively etched or recessed, in particularly advantageous embodiments, TiN and HSG silicon layers are selectively recessed to form bottom electrodes in capacitors for DRAM memory cells. It will be appreciated that such a capacitor can advantageously be a metal-insulator-metal-silicon (MIMS) capacitor having metallic electrodes (e.g., conductive nitride and particularly, refractory metal nitrides). In the illustrated embodiments, the lower, container shaped electrodes serve as charge storage electrodes.

Figure 2:
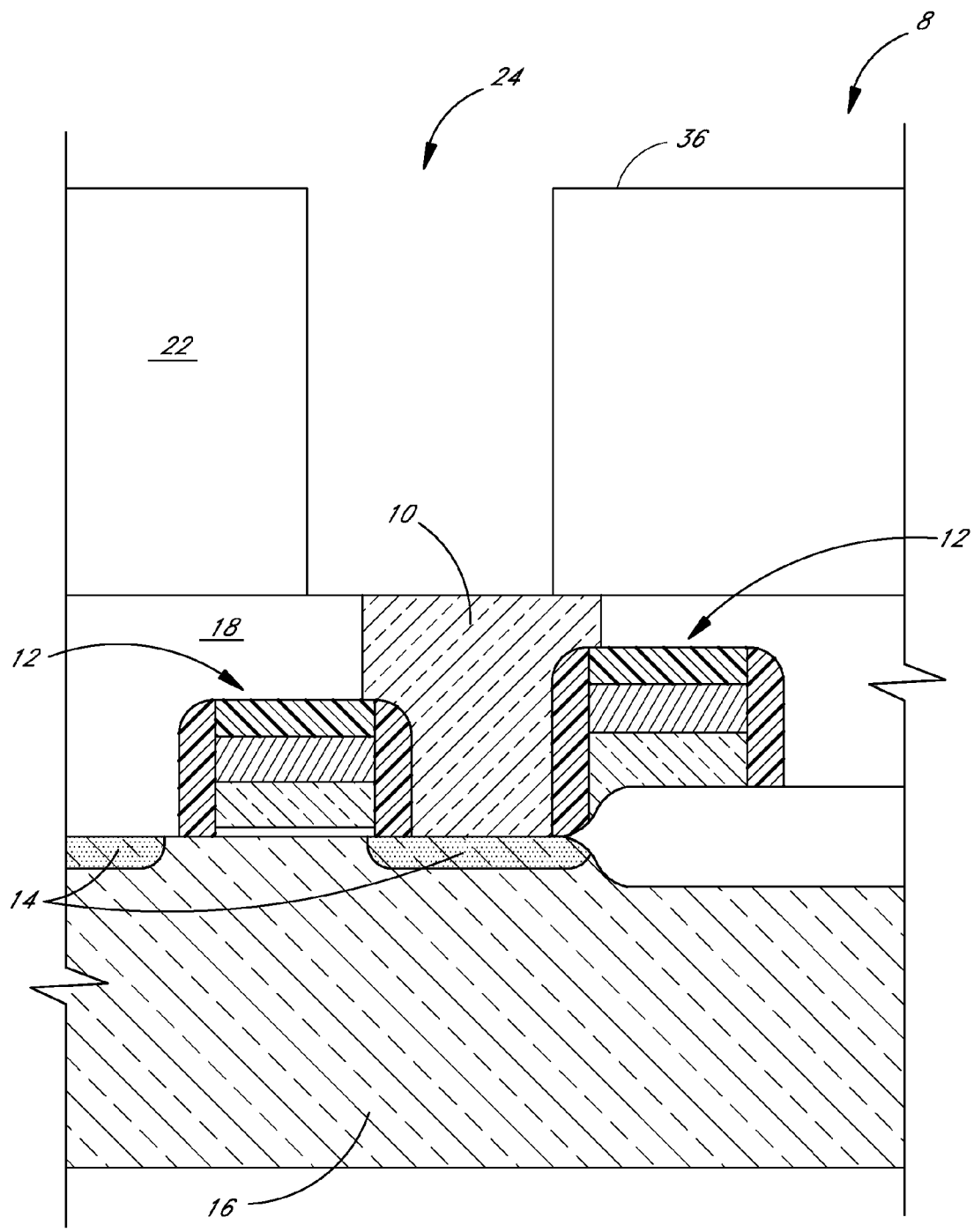
FIG. 2 is a schematic, cross-sectional side view of a partially formed memory cell structure with an open container.

Various processes for forming bottom electrodes in partially formed capacitor structures are known to the skilled artisan. An exemplary process for forming a simple dynamic random access memory (DRAM) cell is illustrated in FIGS. 2-6. FIG. 2 shows a partially fabricated memory cell within an integrated circuit, formed as known in the art. A conductive plug 10 between neighboring word lines 12, preferably comprising polysilicon, forms electrical contact with an active area 14 of a semiconductor substrate 16, e.g., the top of a silicon wafer. The skilled artisan will appreciate that the semiconductor "substrate" is generally the lowest level of active semiconductor material in the integrated circuit and can be an epitaxial layer or the wafer itself. A planarized lower insulating layer 18, generally an oxide, preferably surrounds the word lines 12. The plug 10 is formed within an opening through the lower insulating layer 18, and an upper insulating layer 22 overlies the lower insulating layer 18 in turn. The upper insulating layer 22 can also comprise a layer of an oxide. The oxides forming the upper and lower insulating layers 18 and 22, can be silicon dioxide, borophosphosilicate glass (BPSG), phosphoric silicate glass (PSG), low k material, etc., although preferably, the oxide for both layers 18 and 22 is the same and comprises BPSG.

An open container 24 is formed within the upper insulating layer 22, exposing the conductive plug 10. The container 24 is generally etched anisotropically through a mask, resulting in a cylindrical container 24 with fairly vertical sidewalls, in accordance with conventional integrated circuit contact formation. (Note that FIG. 2 is a schematic cross-section that does not show the back wall of the container. In reality, the container resembles a three-dimensional cylinder.) The dimensions of the container 24 are chosen based upon the requirements of the integrated circuit of which it is a part. It will be appreciated that as dimensions continue to be scaled below the submicron level, the container will likely shrink in the horizontal dimension. The height of the container, however, should at least remain constant and, more likely, will increase in order to maintain the capacitance of previous-generation memory cells. For modem DRAM, the container 24 is preferably has a width or diameter between about 0.03 µm and about 1.0 µm, preferably less than about 0.5 µm, and most preferably less than about 0.2 µm. The dimensions are preferably determined by balancing competing considerations of maximizing cell width while minimizing risk of shorting between electrodes of adjacent memory cells for any DRAM array. In addition, the depth of the container 24 is preferably between about 0.5 µm and about 5.0 µm, and most preferably between about 1.0 µm and about 3.0 µm.

Figure 3:
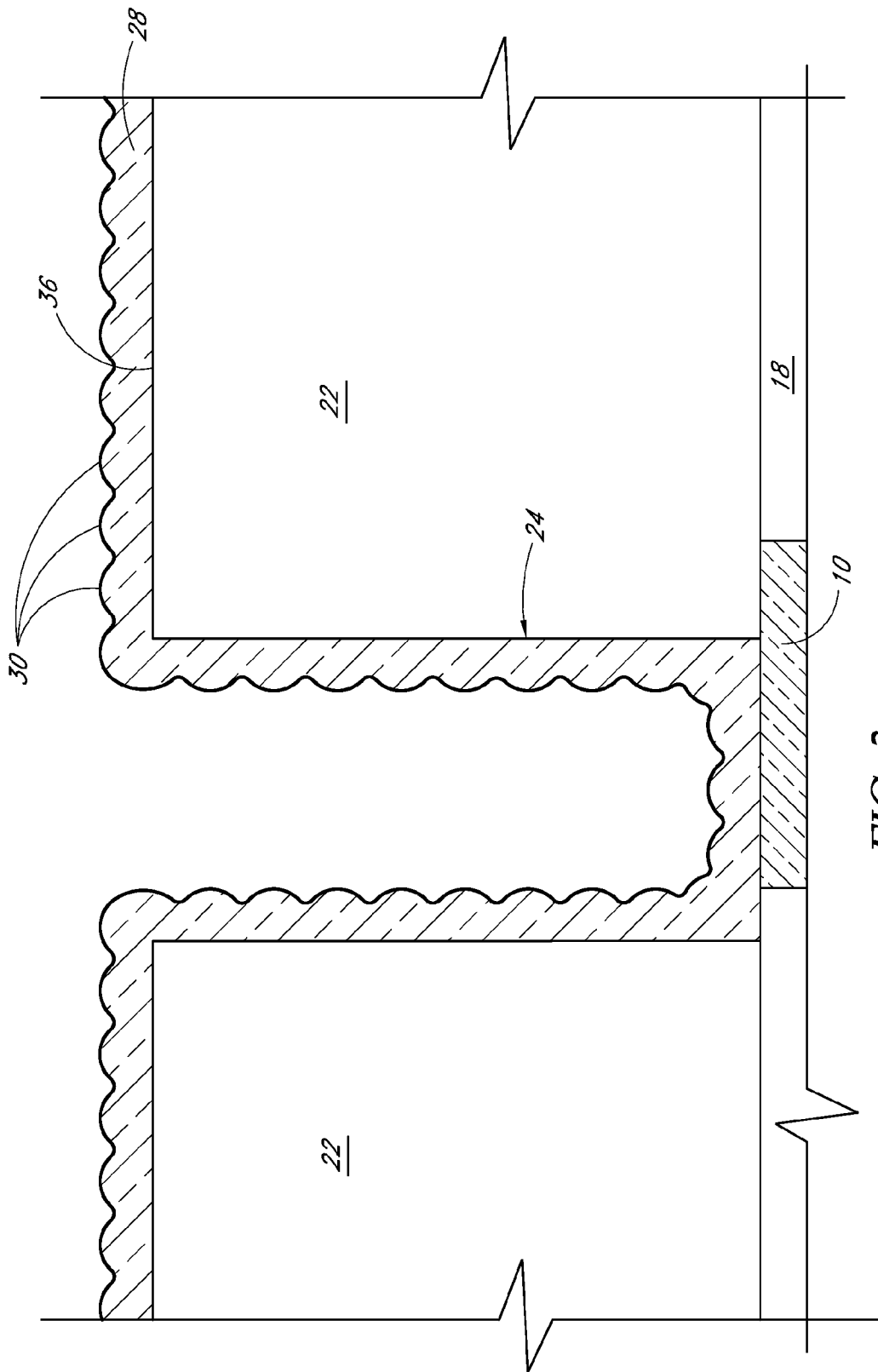
FIG. 3 is a schematic, cross-sectional side view of the partially formed memory cell structure of FIG. 2 after forming a hemispherical grain silicon (HSG) layer.

With reference to FIG. 3, a conductive layer 28 is then formed over the upper insulating layer 22 to form the bottom electrode. As illustrated, the conductive layer 28, which both lines the inside surfaces of the container 24 and overlies the unetched upper insulating layer 22, preferably comprises HSG silicon. Advantageously, as noted above, HSG silicon provides a surface with a high surface area, to increase the capacitance of the resulting capacitor. As is apparent from FIG. 3, the bottom electrode surface follows the contours of individual hemispherical grains 30 of the HSG silicon 28, providing a considerably greater surface for the bottom electrode than a smooth bottom electrode. Formation of taller grains 30, or increased "bump height," would tend to even further increase electrode surface area and cell capacitance.

The HSG silicon may be formed by a number of different methods known in the art, including low pressure CVD (LPCVD), silicon deposition followed by vacuum anneal under specified temperature and pressure conditions, and gas phase nucleation. For example, in a gas phase nucleation, an extremely thin layer of oxide may serve as a seed layer for HSG growth to follow. Native oxide is allowed to grow over a silicide substrate. Polysilicon may then be deposited by low pressure chemical vapor deposition (LPCVD), and silicon grains grow preferentially about nucleation sites provided by the native oxide. Nucleation sites may also be provided by the deposition of dispersed particles as disclosed by U.S. Pat. No. 5,102,823, issued to Tuttle, the disclosure of which is hereby incorporated by reference. In either case, during the initial stages of polysilicon deposition, the presence of these nucleation sites causes the formation of polysilicon nodules. During later stages of deposition, polysilicon will continue to coat the previously created nodules, resulting in stable, hemispherical polysilicon grains 30.

Details of an exemplary vacuum anneal method for forming HSG silicon by a surface seeding method can be found in U.S. Pat. No. 5,407,534, issued to Thakur, the disclosure of which is hereby incorporated by reference. A layer of amorphous silicon is deposited over the polysilicon, preferably to a thickness between about 100 Å and about 500 Å, most preferably about 300 Å. The silicon material then heated to a temperature G in the range of between 450° C. and about 650° C., more preferably between about 560° C. and about 620° C., most preferably around 600° C., while the chamber pressure is maintained between about $1\times10^{-10}$ Torr and about $1\times10^{-3}$ Torr. An inert gas (e.g., argon), is bled into the anneal chamber. The surface migration of the silicon atoms to the nucleation sights results in the formation of a rough or texturized, granular surface having a much greater surface area for charge storage. The resulting electrode material 28, including HSG silicon grains 30, forms the bottom or storage electrode of a memory cell capacitor. Advantageously, a fluorine-based gas (e.g., $NF_3$, $CF_4$, or $C_2F_6Cl_2$), diluted with the inert gas (e.g., argon), enhances the redistribution or migration of the silicon atoms.

FIG. 3 illustrates a resultant HSG silicon layer 28, comprised of high-surface area hemispherical grains or "bumps" 30. It will be appreciated that the HSG layer 28 can be doped by methods known in the art to increase its conductivity.

Figure 4:
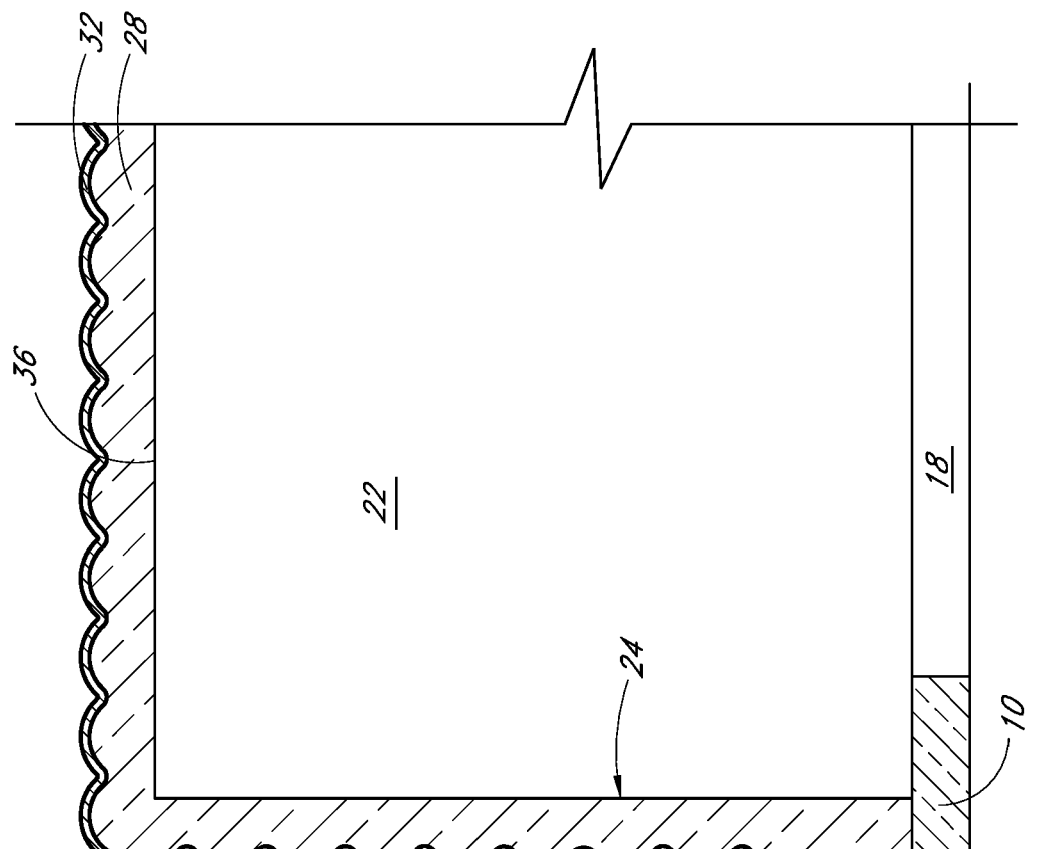
FIG. 4 is a schematic, cross-sectional side view of the partially formed memory cell structure of FIG. 3 after depositing a titanium nitride layer.
Figure 5:
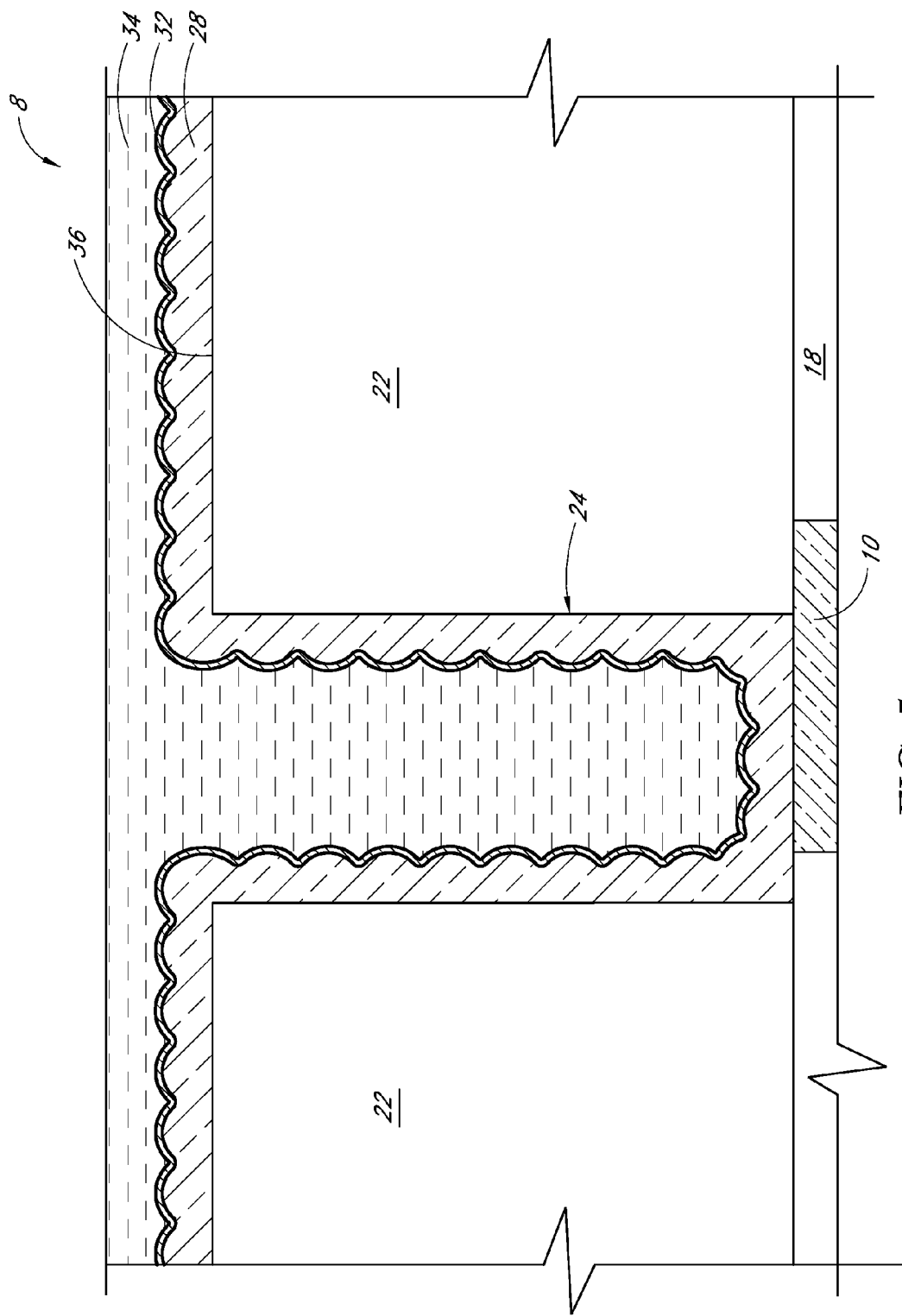
FIG. 5 is a schematic, cross-sectional side view of the partially formed memory cell structure of FIG. 4 after depositing photoresist.

As shown in FIG. 4, a metallic layer is then deposited over the HSG layer 28. Preferably, the metallic layer is a metal nitride, more preferably a refractory metal nitride and, in the illustrated embodiment, is a titanium nitride layer 32. Then, as shown in FIG. 5, a photoresist layer 34 is deposited over the TiN layer 32 to fill the container 24.

Figure 6:
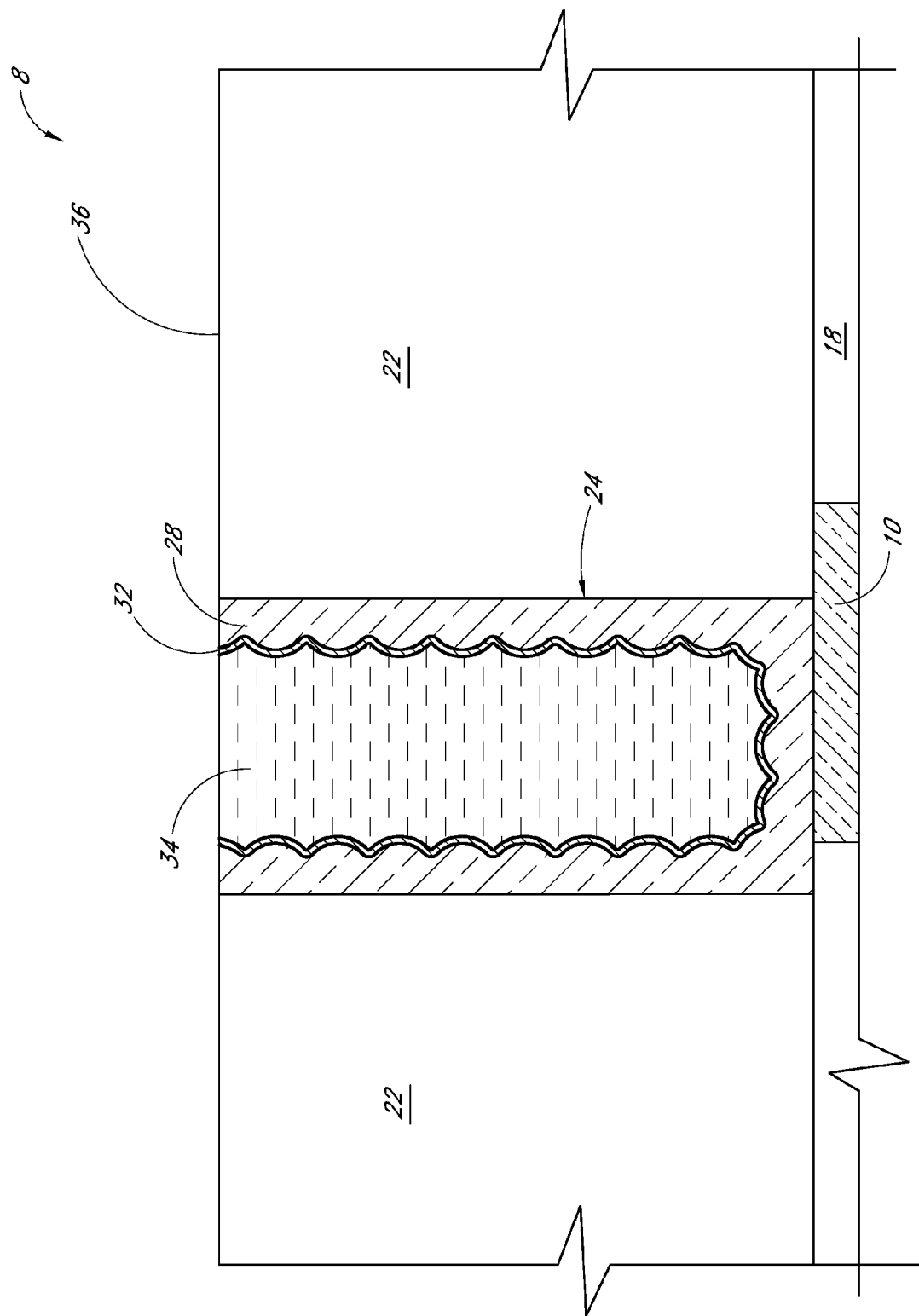
FIG. 6 is a schematic, cross-sectional side view of the partially formed memory cell structure of FIG. 5 after planarization.

As shown in FIG. 6, the TiN layer 32 and the HSG silicon layer 28 are then etched back, more preferably planarized, to separate the bottom electrodes, comprising layers 32 and 28, from adjacent capacitors (not shown). By this separation, the bottom electrodes of these adjacent capacitors can be physically and electrically isolated from one another. Planarization is preferably accomplished by CMP. The TiN layer 32 and the HSG silicon layer 28 are preferably removed down to at least the surface 36 of the upper insulating layer 22. In other arrangements, a CMP stop layer (not shown) can be deposited over the insulating layer 22 and the removal of the TiN layer 32 and the HSG silicon layer 28 proceeds down to the level of this stop layer.

Next, the bottom electrode is recessed. Where the bottom electrode comprises the TiN layer 32 and the HSG silicon layer 28, each layer is preferably recessed separately. More preferably, the TiN layer 32 is recessed first and then the HSG silicon layer 28 is recessed.

Figure 7:
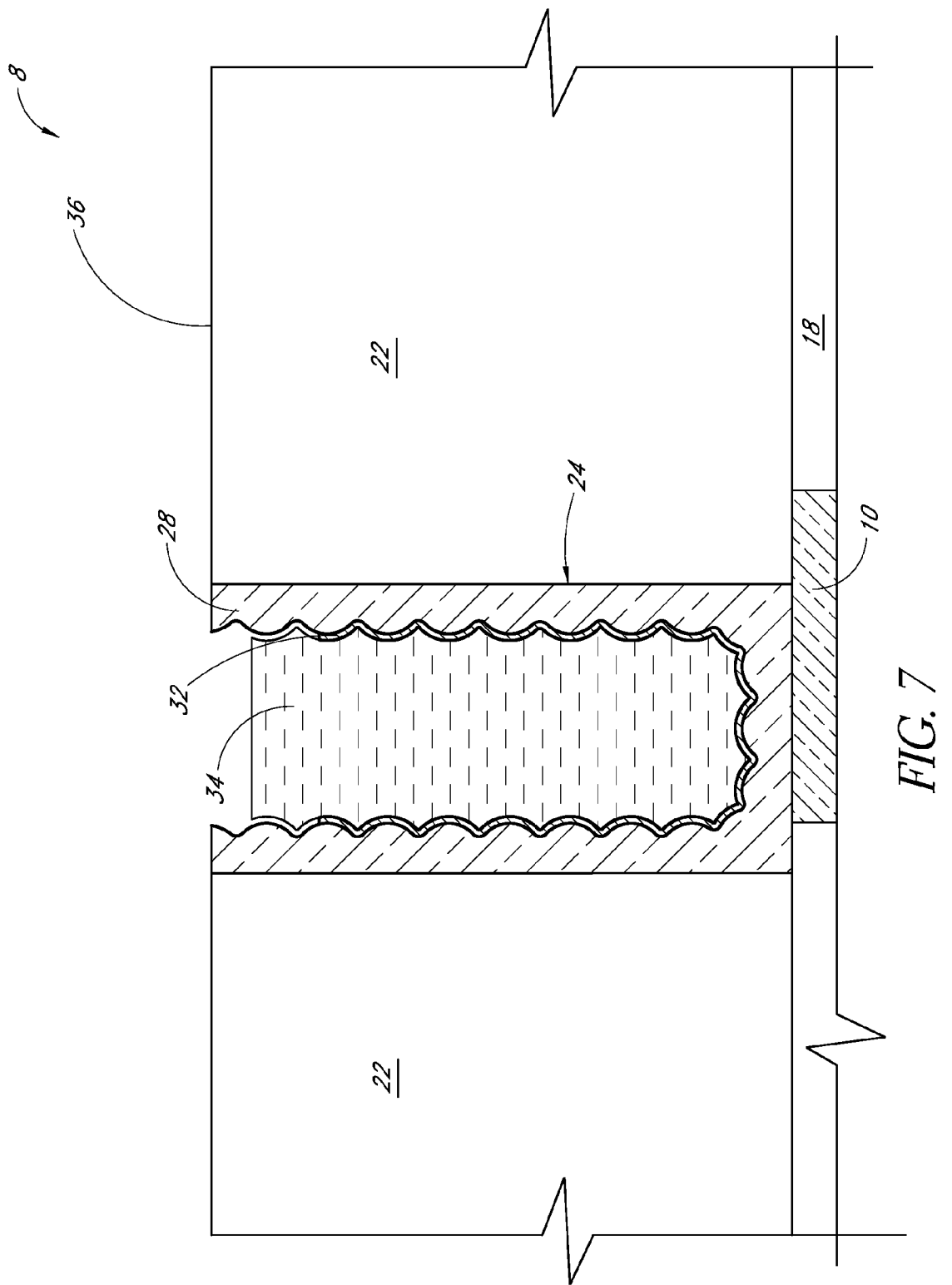
FIG. 7 is a schematic, cross-sectional side view of the partially formed memory cell structure of FIG. 6 after recessing the titanium nitride layer in accordance with preferred embodiments of the invention.

Thus, as shown in FIG. 7, a top portion of the TiN layer 32 proximate the lip of the container 24 can be etched. Preferably, the etchant is a peroxide and, more preferably, the etchant is an ammonium hydroxide/peroxide mixture (APM, $H_2O_2/NH_4OH$) or a hydrochloric acid/peroxide mixture (HPM, $H_2O_2/HCl$). Preferably, the etchants and process conditions are chosen such that the depth of the recess is sufficient to prevent electrical shorts with TiN or HSG silicon particles overlying neighboring containers 24. It has been found that recess depths of the between about 100 Å and about 500 Å, more preferably, between about 150 Å to about 250 Å and, most preferably, about 200 Å below the top surface 36 advantageously provide adequate electrical isolation of the TiN and HSG silicon bottom electrode layers 32 and 28 while also minimizing undesirable reductions in the surface area of the bottom electrode.

Thus, in one preferred embodiment, the TiN layer 32 is exposed to an APM. The APM preferably comprises between about 0.33 weight percent (wt. %) and about 4.8 wt. % $H_2O_2$ and about 0.18 wt. % and about 3.9 wt. % $NH_4OH$, more preferably between about 0.70 wt. % and about 1.50 wt. % $H_2O_2$ and about 0.51 wt. % $NH_4OH$. The etch preferably occurs with the partially fabricated integrated circuit 8 at a temperature between about 20° C. and about 55° C., more preferably, between about 30° C. and about 50° C. and, most preferably, between about 35° C. and about 50° C.

In another preferred embodiment, the TiN layer 32 is exposed to an HPM. The HPM preferably comprises between about 0.33 wt. % and about 4.8 wt. % $H_2O_2$ and about 0.18 wt. % and 4.9 wt. % HCl, more preferably between about 0.90 wt. % and about 1.60 wt. % $H_2O_2$ and about 0.50 wt. % and about 1.00 wt. % HCl. The etch preferably occurs with the partially fabricated integrated circuit 8 at a temperature between about 20° C. and about 75° C., more preferably, between about 30° C. and about 65° C. and, most preferably, between about 45° C. and about 65° C.

It will be appreciated that while the etchant dilutions and process conditions, such as temperature, are such that the removal of TiN layer 32 is selective, the TiN layer recess need not be completely selective; that is, the removal is selective to the extent that the TiN 32 is recessed to a greater extent than the photoresist 34 or surrounding insulating material 22, so that the photoresist protects the sides of the TiN layer 32 during subsequent etches. Preferably, depending upon the composition of the layers to be removed, the etchant dilutions and process temperature are chosen such that the removal rate of TiN layer 32 is greater than about 10 times and, more preferably, greater than about 15 times more selective than the removal rate of the photoresist and insulating material 22; that is, TiN layer 32 is preferably removed at a rate more than about 10 times and, more preferably, more than about 15 times greater than the rate at which photoresist 34 and insulating material 22 is removed.

Figure 8:
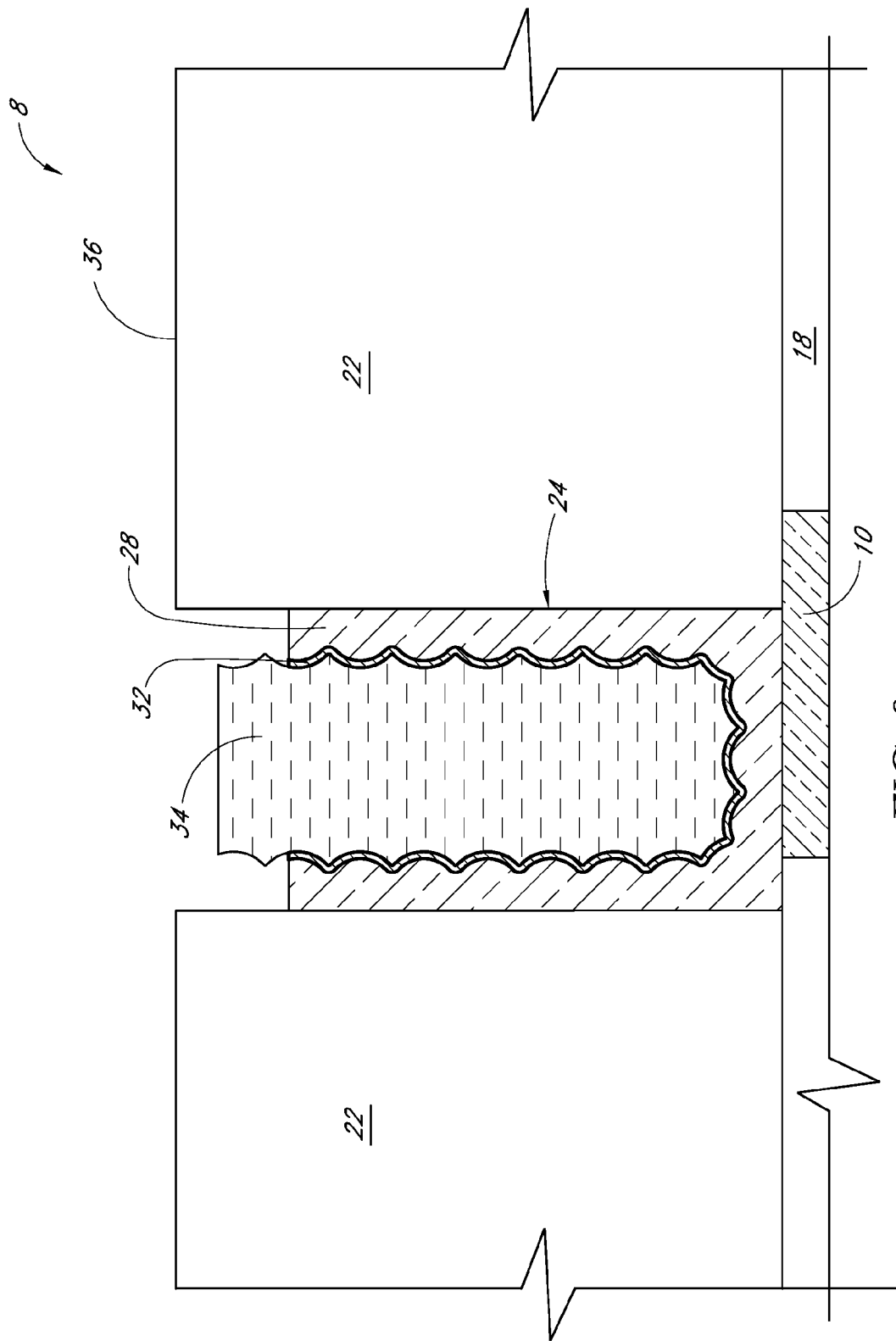
FIG. 8 shows a schematic side view of the partially formed memory cell structure of FIG. 7 after recessing the HSG silicon layer in accordance with preferred embodiments of the invention.

Next, as shown in FIG. 8, a top portion of the HSG silicon layer 28 is etched. Preferably, the etchant is between about 1% and about 4%, more preferably, between about 2% and about 3% and, most preferably, about 2.25% TMAH. In addition, the etch preferably takes place at temperature higher than used for a conventional etch. Preferably, the temperature is greater than about 40° C., more preferably, greater than about 50° C. and, most preferably, between about 50° C. and about 65° C. In addition, the etchants and process conditions are preferably chosen such that the depth of the recess is between about 100 Å and about 500 Å and, more preferably, between about 150 Å to about 250 Å and, most preferably, about 200 Å, to provide adequate isolation while minimizing surface area loss, as described above. While the depth of the recess of each of the TiN and HSG silicon layers 28 and 32, respectively, are preferably similar, it will be appreciated that the depth of the HSG silicon layer recess need not be the same as the TiN layer recess, so long as the recess is of each layer is sufficient to address the problem of electrical shorts discussed above.

Figure 9:
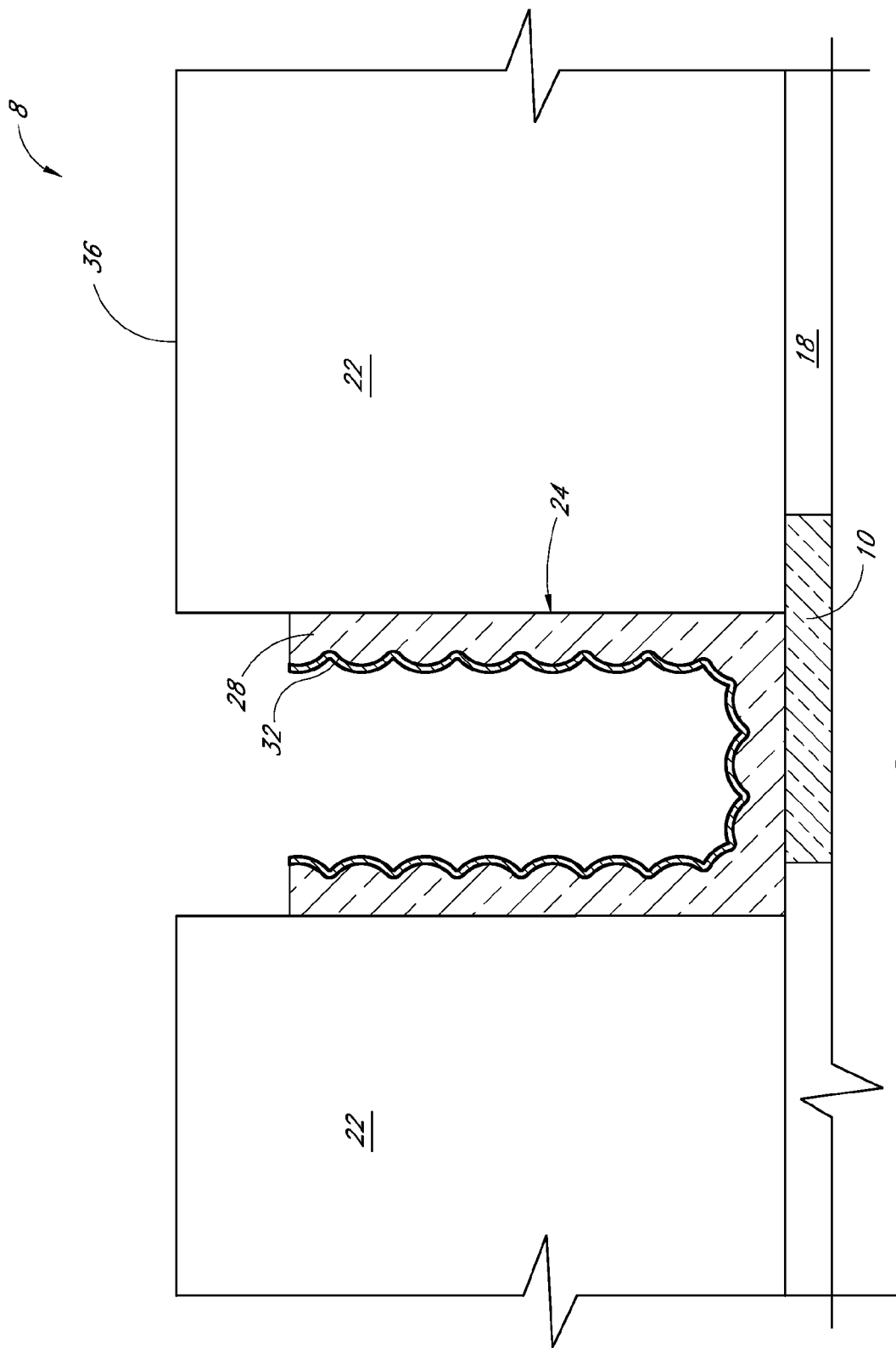
FIG. 9 shows a schematic side view of the partially formed memory cell structure of FIG. 8 after removing the photoresist.
Figure 10:
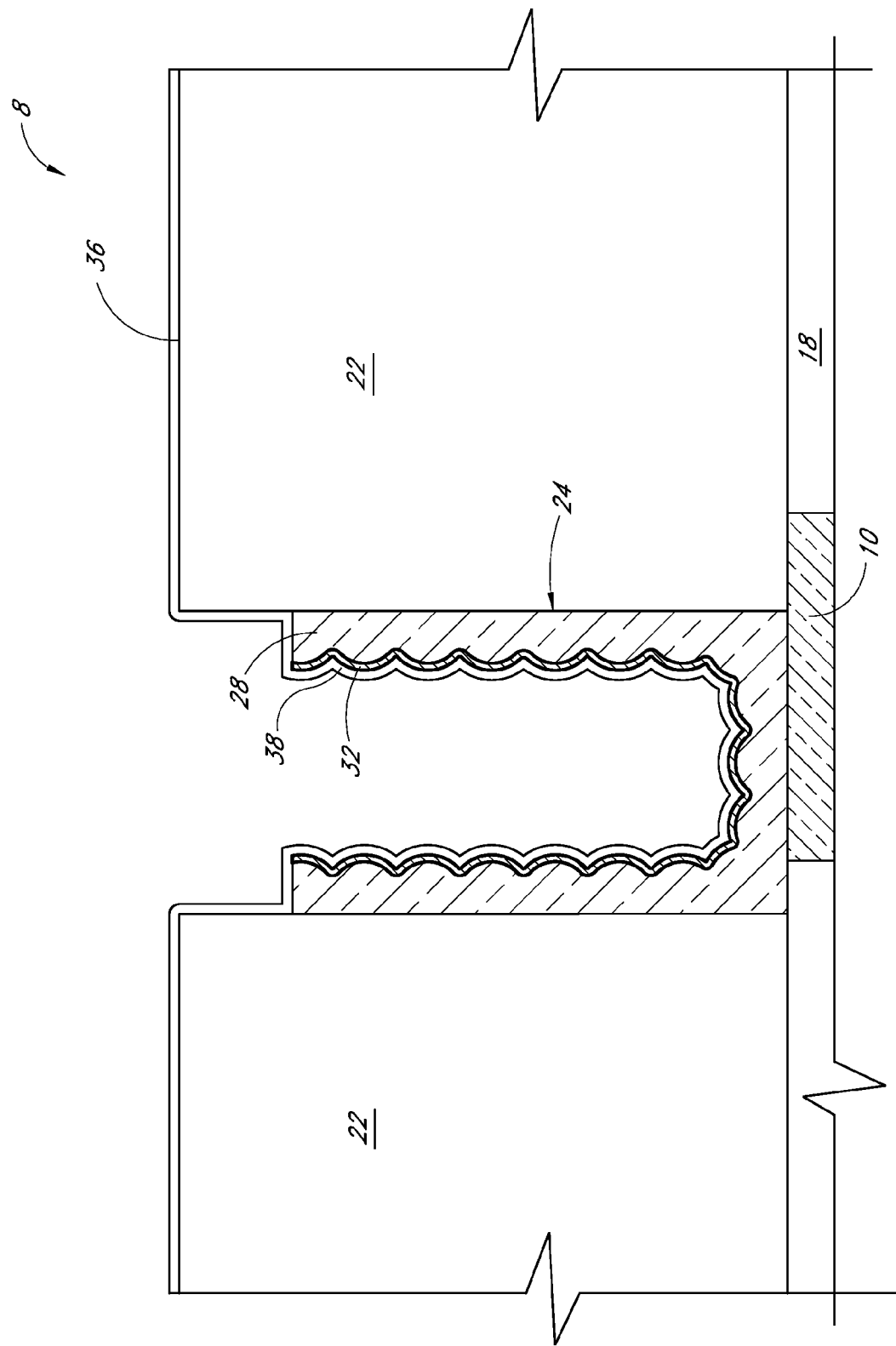
FIG. 10 shows a schematic side view of the partially formed memory cell structure of FIG. 9 after deposition of a dielectric layer.

As shown in FIG. 9, the photoresist 34 is subsequently removed from the container 24. As shown in FIG. 10, a capacitor dielectric layer 38 is then conformally deposited over the HSG silicon 28. Preferably, the dielectric layer 38 comprises a silicon nitride, but it will be understood that the present invention may be utilized in conjunction with any suitable dielectric material.

Figure 11:
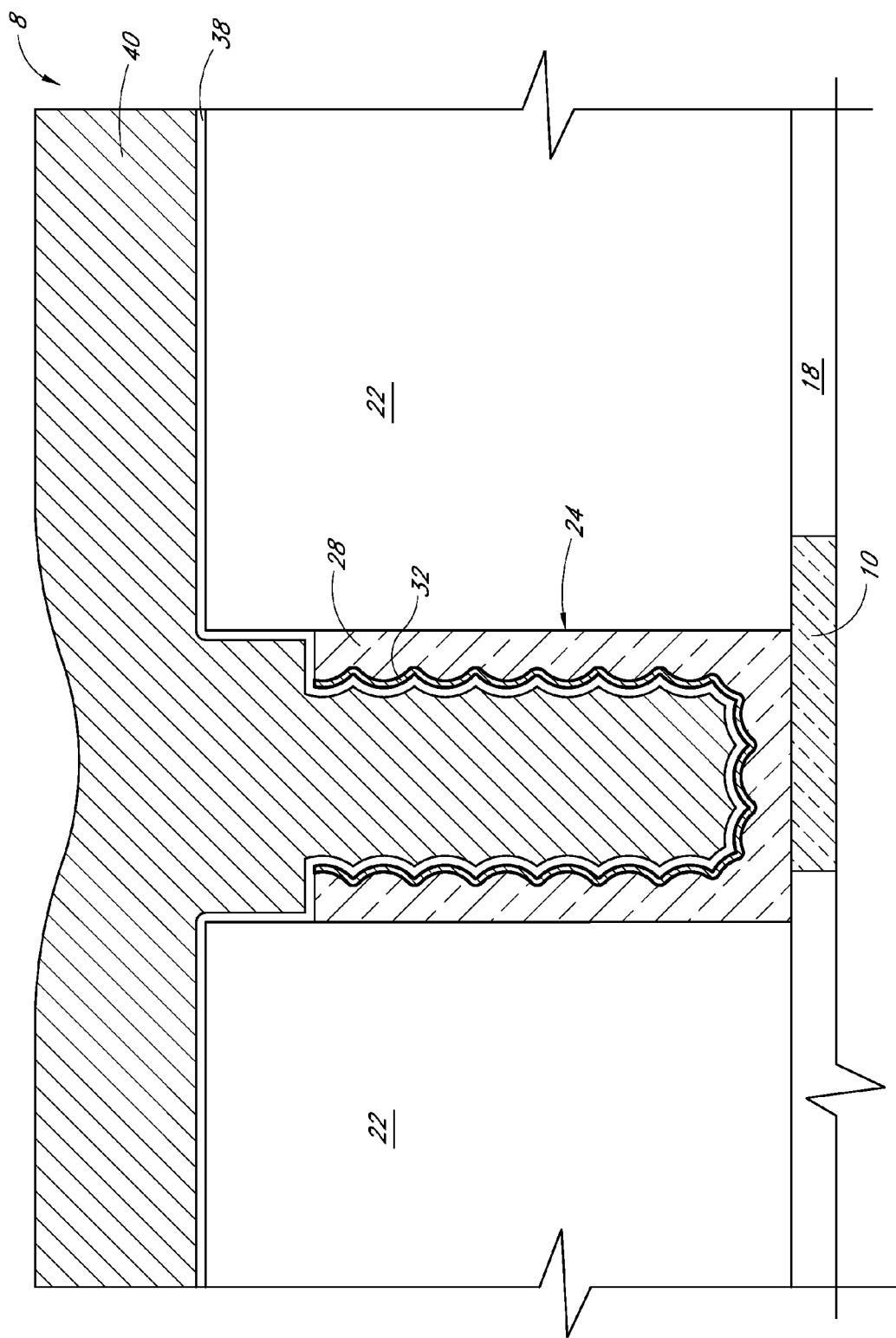
FIG. 11 shows a schematic side view of the partially formed memory cell structure of FIG. 10 after formation of the top capacitor electrode.

As shown in FIG. 11, a conductive top electrode layer 40 is deposited, in turn, over the capacitor dielectric 38. The top electrode 40 can be formed of any conductive material suitable for use in forming integrated circuit capacitors. For example, the top electrode can be a polysilicon layer or a silicide. Preferably, for MIM capacitors, including MIMS capacitors, the top electrode is metallic, e.g., TiN, HfN, etc.

It will be appreciated that while the TiN layer 32 is illustrated being recessed before the HSG silicon layer 28 is recessed, in other embodiments, the HSG silicon layer 28 can be recessed first. In addition, while the preferred embodiments have been discussed in terms of recessing both TiN layer 32 and a HSG silicon layer 28, in other embodiments, the recess of both layers may not be necessary. For example, in embodiments applied to capacitors in which the bottom electrode does not comprise HSG, e.g., where the bottom electrode comprises only TiN, only the TiN layer is recessed.

It will also be appreciated that while the containers have been illustrated as cylindrical structures for ease of illustrate, the containers can be any shape suitable for use in forming a capacitor. For example, the container can be generally rectangular, or elongated on one axis to form a trench or tube shaped volume. In addition, while the preferred embodiments have been discussed primarily with respect to the fabrication of capacitors in DRAM, in other embodiments the methods discussed herein can be applied to other types of memory or any other integrated circuits having capacitors.

In addition, the etch processes disclosed herein can be applied to selectively etch TiN, with or without HSG silicon, on semiconductor substrates generally, especially where selective etch of TiN relative to photoresist and/or BPSG is desired. In embodiments without HSG, e.g., MIM rather than MIMS capacitors, it will be appreciated that the decreased surface area of the bottom electrode, e.g., TiN, allows for faster penetration of etchants down the height of the container. In such cases, process conditions can be varied to prevent over-etching down the height of the container and laterally to the photoresist. For example, process temperatures and/or etchant concentrations can be decreased relative to a MIMS capacitor. In addition, the substrate can be heat treated to dry out the photoresist and decrease its susceptibility to being etched. Preferably, the heat treatment is performed for about 30-120 seconds at about 130-250° C. and, more preferably, about 130-200° C.

It will be appreciated that the preferred embodiments offer numerous advantages. For example, whereas peroxide mixtures have traditionally been unsuitable for recessing metal nitrides, such as TiN, because they consume photoresist and leave the sides of the metal nitride layer exposed to attack by etchants, the preferred embodiments are able to selectively remove metal nitride relative to photoresist and any surrounding insulating layer materials, such as BPSG. Desirably, because the photoresist is not consumed, the metal nitride layer is preserved and the conductivity benefits of a bottom electrode comprising the metal nitride layer are maintained, while electrical shorts caused by inadequate recess of the metal nitride and HSG silicon layers can be prevented. Moreover, the chemistries discussed above further minimize the possibility of shorts by also etching the HSG and/or metal nitride particles which are the cause of the shorts discussed above.

In addition, as discussed above, conventional processes using TMAH as the etchant have been unable to recess the HSG silicon layer due in part to the diffusion from the metal nitride layer, e.g., of titanium atoms from TiN layers, into the HSG silicon layer, forming a difficult to etch material. In contrast, the present invention allows the metal nitride/HSG silicon material to be effectively recessed to address the problem of electrical shorts. Advantageously, the recess of the metal nitride layer before the HSG silicon layer increases the surface area of the HSG silicon layer that is open to exposure to etchants, to more easily allow the HSG silicon layer to be etched.

Figure 12A:
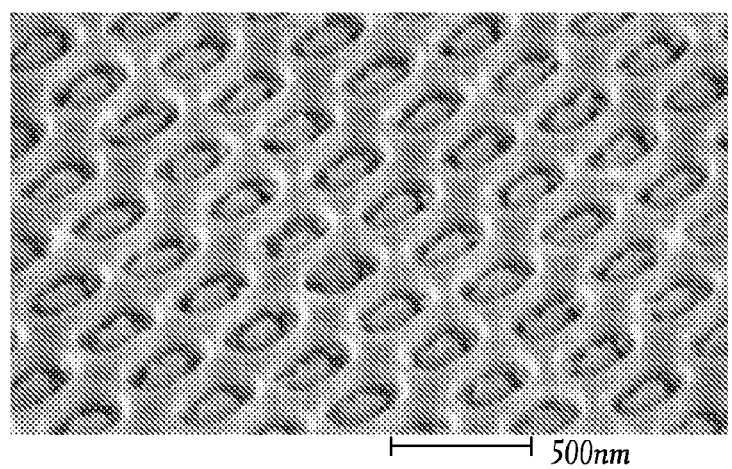
FIGS. 12A, 12B and 12C are micrographs, as viewed through a scanning electron microscope, of an array of capacitor structures after being etched.
Figure 12B:
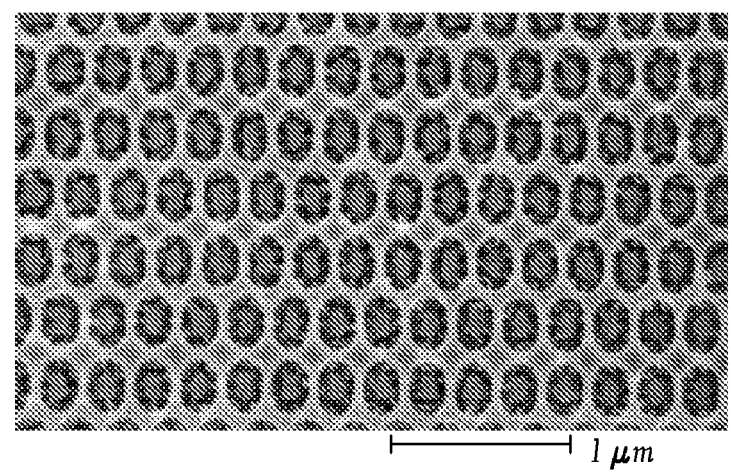
Figure 12C:
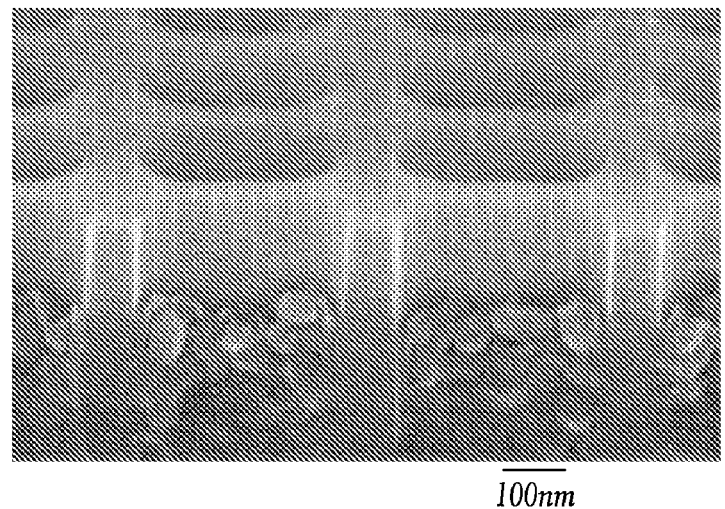

FIGS. 12A, 12B and 12C show the resultant partially formed capacitor structure having a TiN/HSG silicon layer bottom electrode. Note that the photoresist is not consumed, while the TiN/HSG layers are successfully recessed. Advantageously, a capacitor in an integrated circuit can be formed in a container having a metal nitride, with or without a HSG layer, recessed between about 100 Å and about 500 Å and, more preferably, between about 150 Å to about 250 Å and, most preferably, about 200 Å below the top of the container.

It will be appreciated by those skilled in the art that various omissions, additions and modifications may be made to the methods and structures described above without departing from the scope of the invention. All such modifications and changes are intended to fall within the scope of the invention, as defined by the appended claims.

I claim:

1. An integrated circuit comprising a capacitor, the capacitor comprising:
    a structural layer above a semiconductor substrate, wherein a container is disposed in the structural layer, wherein a wall of the container has a top surface;
    a bottom electrode extending vertically along the wall, wherein the bottom electrode comprises a metal nitride layer and a hemispherical grained silicon layer, wherein a top surface of the bottom electrode is about 100 Å to about 500 Å below the top surface of the wall of the container.

2. The integrated circuit of claim 1, wherein the metal nitride layer comprises titanium nitride.

3. The integrated circuit of claim 1, wherein the structural layer is an insulating layer.

4. The integrated circuit of claim 3, wherein the insulating layer is an oxide layer.

5. The integrated circuit of claim 4, wherein the oxide layer comprises borophosphosilicate glass.

6. The integrated circuit of claim 4, wherein the capacitor is a cell capacitor in a memory circuit.

7. An integrated circuit, comprising:
    an insulating layer having a cavity, the cavity partially defined by a generally vertical surface of the insulating layer; and
    a generally vertically extending metallic layer disposed between the vertical surface and a generally vertically extending layer of an other material inside the cavity, wherein the vertical surface is between about 0.5 μm and about 5.0 μm in height and wherein the metallic layer is between about 100 Å and about 500 Å below a top of the vertical surface,
    wherein a hemispherical grained silicon layer is disposed between the generally vertical surface and the metallic layer.

8. The integrated circuit of claim 7, wherein the layer of the other material comprises a dielectric layer.

9. The integrated circuit of claim 8, wherein the hemispherical grained silicon layer is between about 100 Å and about 500 Å below a top of the vertical surface.

10. The integrated circuit of claim 8, wherein the dielectric layer comprises silicon nitride.

11. The integrated circuit of claim 8, further comprising a conductor occupying the cavity and disposed immediately adjacent the dielectric layer on a side of the dielectric layer opposite the metallic layer.

12. The integrated circuit of claim 11, wherein the cavity houses a capacitor, wherein the conductor forms a capacitor electrode.

13. The integrated circuit of claim 11, wherein the conductor comprises polysilicon or a silicide.

14. The integrated circuit of claim 7, wherein the integrated circuit is a memory device.

* * * * *